United States Patent [19]

Naradone et al.

[11] Patent Number: 5,265,053
[45] Date of Patent: Nov. 23, 1993

[54] MAIN MEMORY DRAM INTERFACE

[75] Inventors: Joseph M. Naradone, Portland; Tom M. Skorio, Beaverton, both of Oreg.

[73] Assignee: Intel Corporation, Santa Clara, Calif.

[21] Appl. No.: 725,571

[22] Filed: Jul. 3, 1991

[51] Int. Cl.5 ................................................. G11C 7/00
[52] U.S. Cl. ................................. 365/193; 365/230.03
[58] Field of Search .............. 365/193, 230.01, 230.03, 365/230.06, 233

[56] References Cited

U.S. PATENT DOCUMENTS 4,916,603  4/1990  Ryan et al. ...................... 365/230.03

Primary Examiner—Steven Mottola
Attorney, Agent, or Firm—Blakely, Sokoloff, Taylor & Zafman

[57] ABSTRACT

An interface is described for a memory array including a multiplicity of DRAMs organized as a partition providing data storage and data coherency storage. The interface includes a RAS controller and a CAS controller. The RAS controller resides on a first semiconductor substrate. The RAS controller receives a RAS strobe signal and generates a data RAS signal and a data coherency RAS signal. The data RAS signal has a minimum skew with respect to said data coherency RAS signal. The CAS controller resides on a second semiconductor substrate. The CAS controller receives a memory array write enable signal for selecting byte reads and byte writes, as well as a CAS strobe signal, said CAS controller generating a multiplicity of byte CAS signals and a multiplicity of byte write enable signals for said partition, said multiplicity of byte CAS signals having a minimum skew with respect to said multiplicity of byte write enable signals by minimizing skew, the interface reduces the access time of the DRAM memory array.

23 Claims, 11 Drawing Sheets

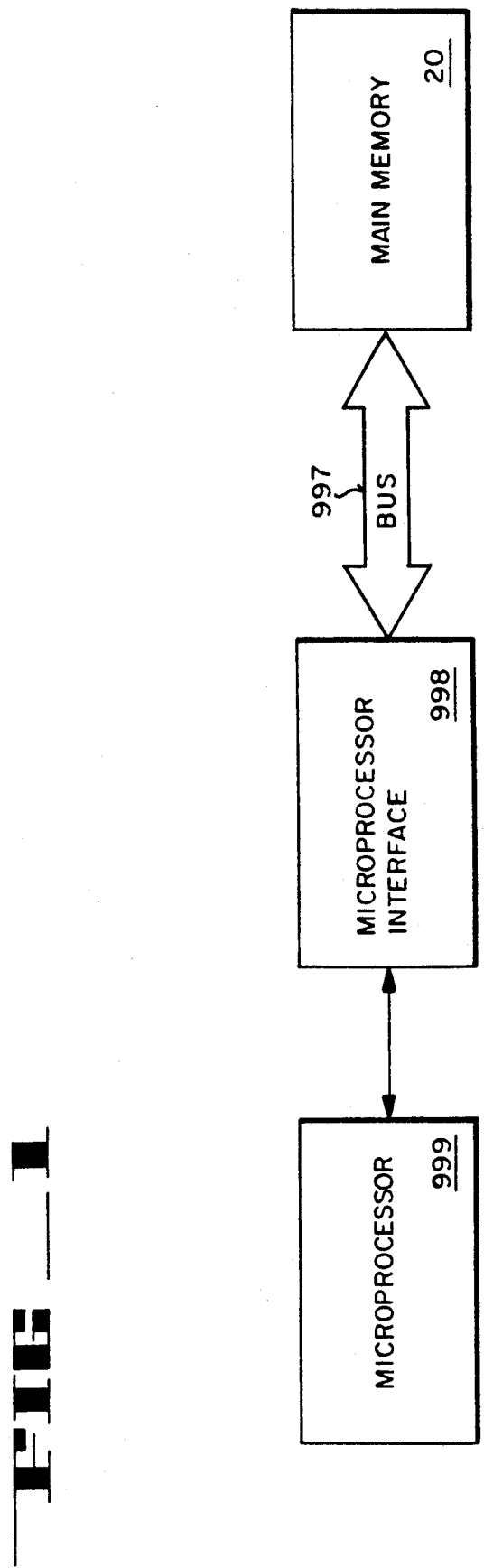
FIG_1

FIG_2A
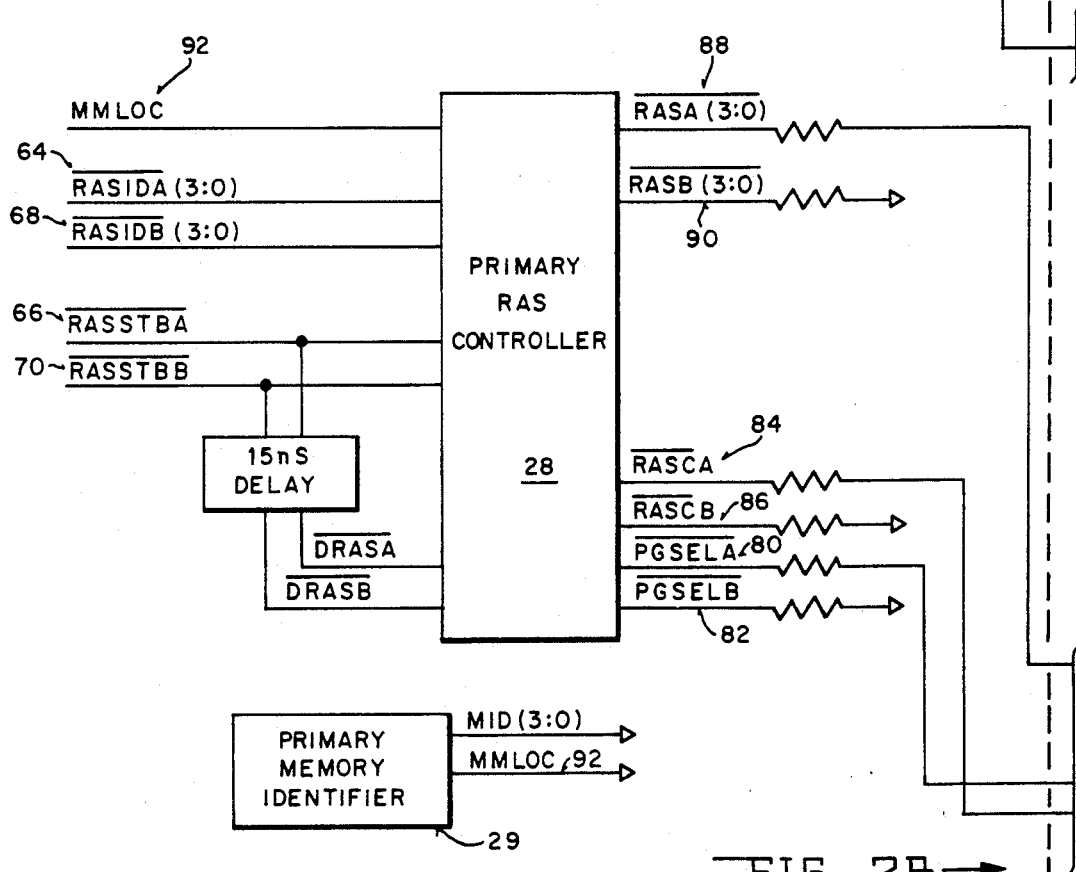

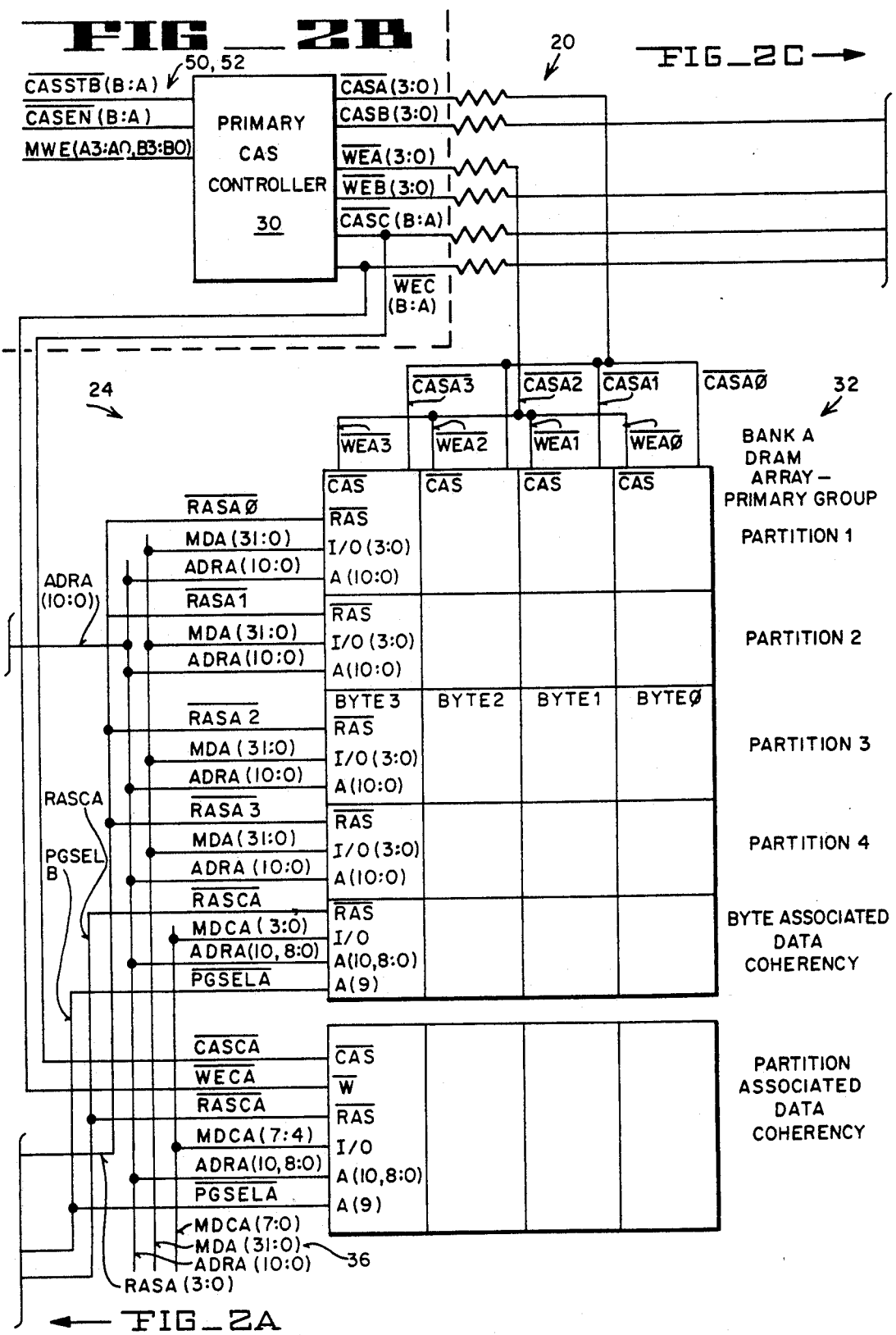

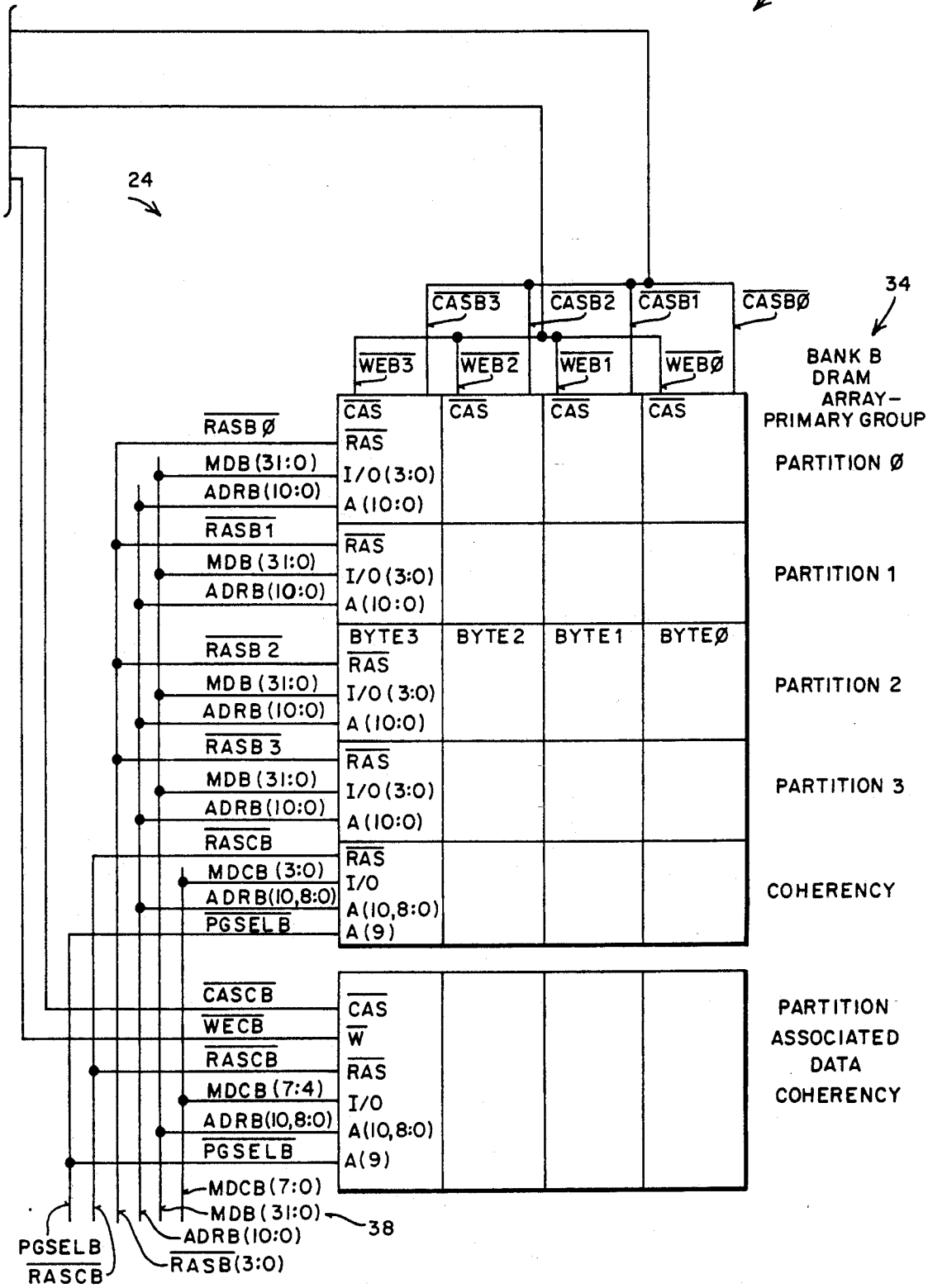

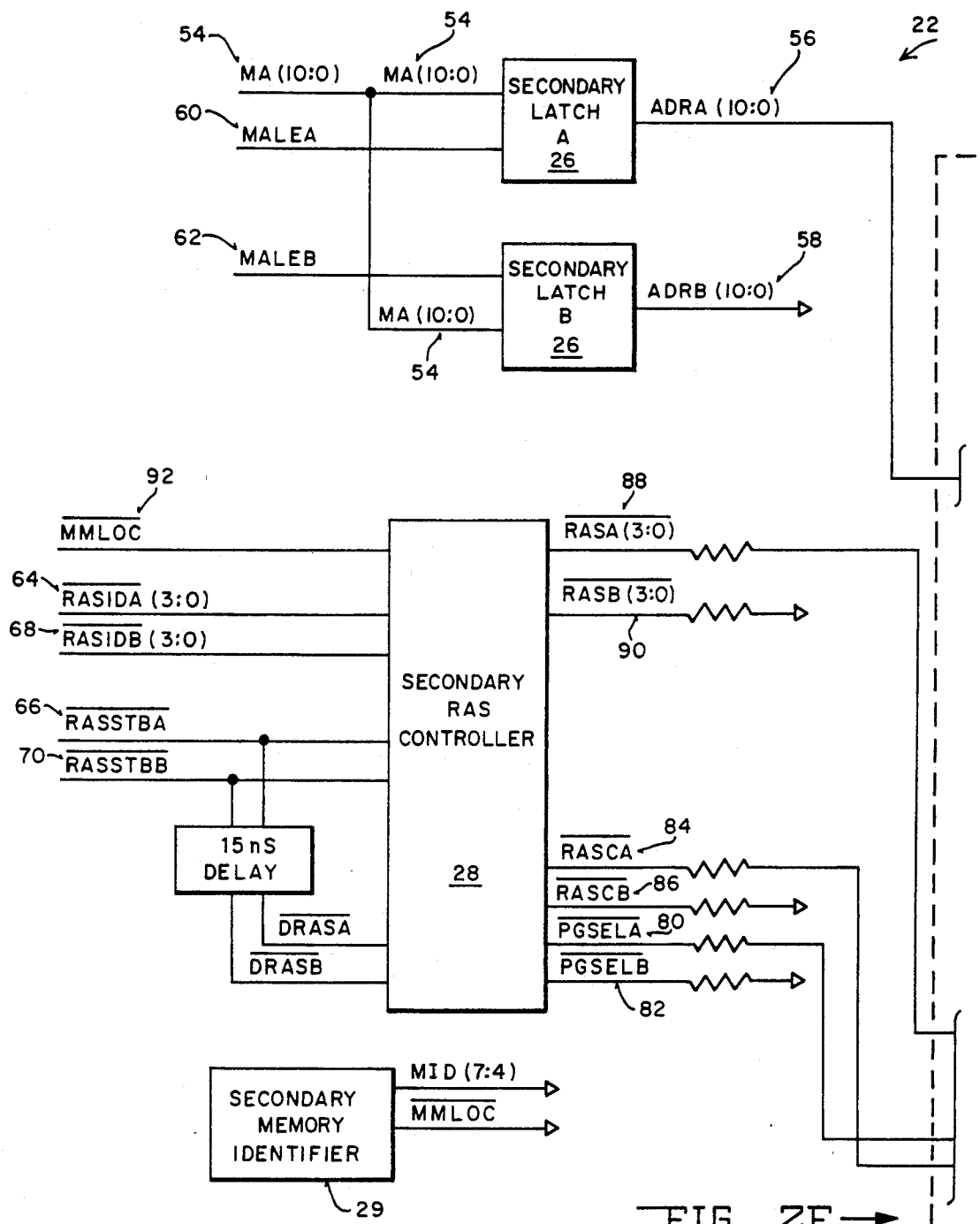

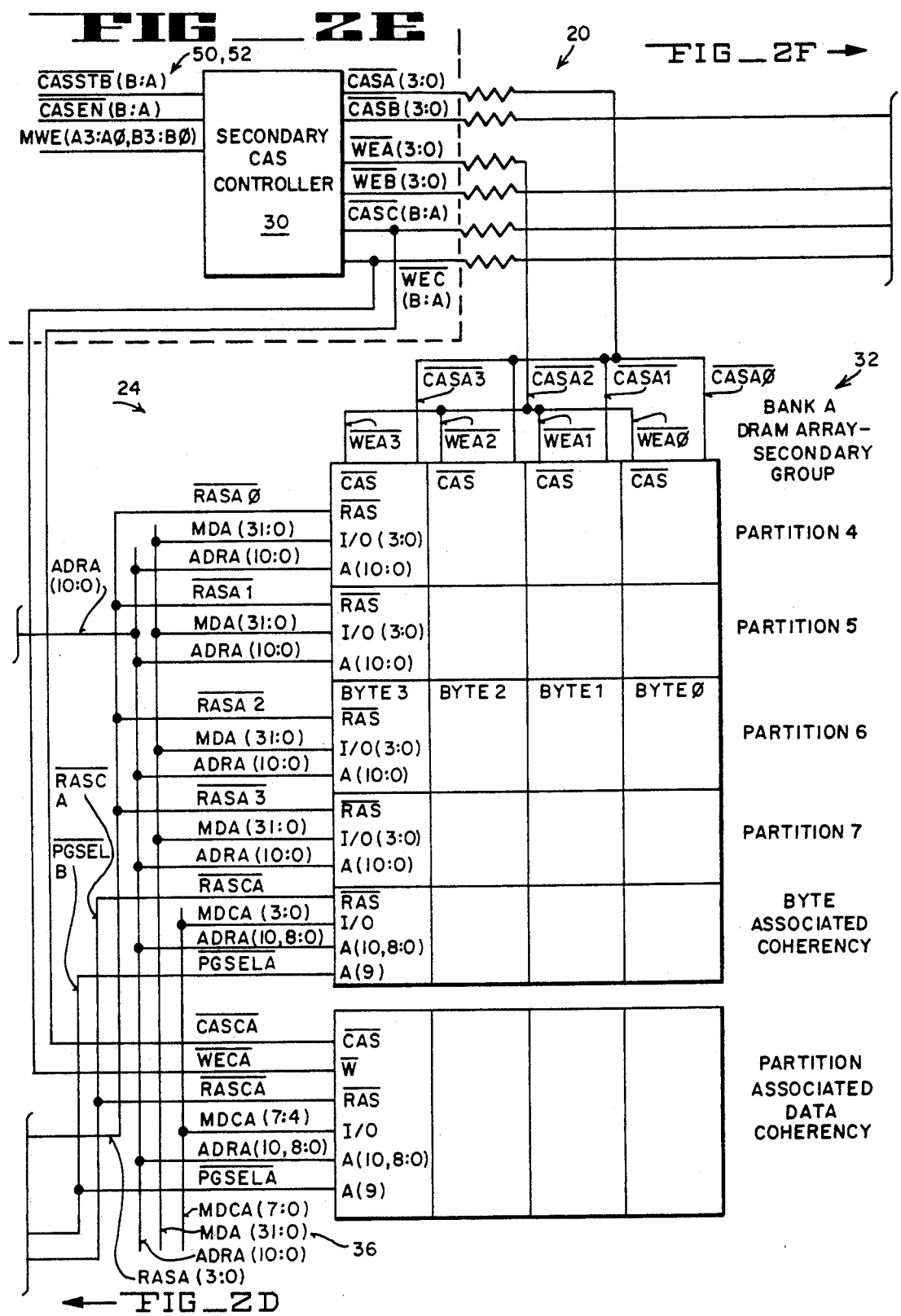

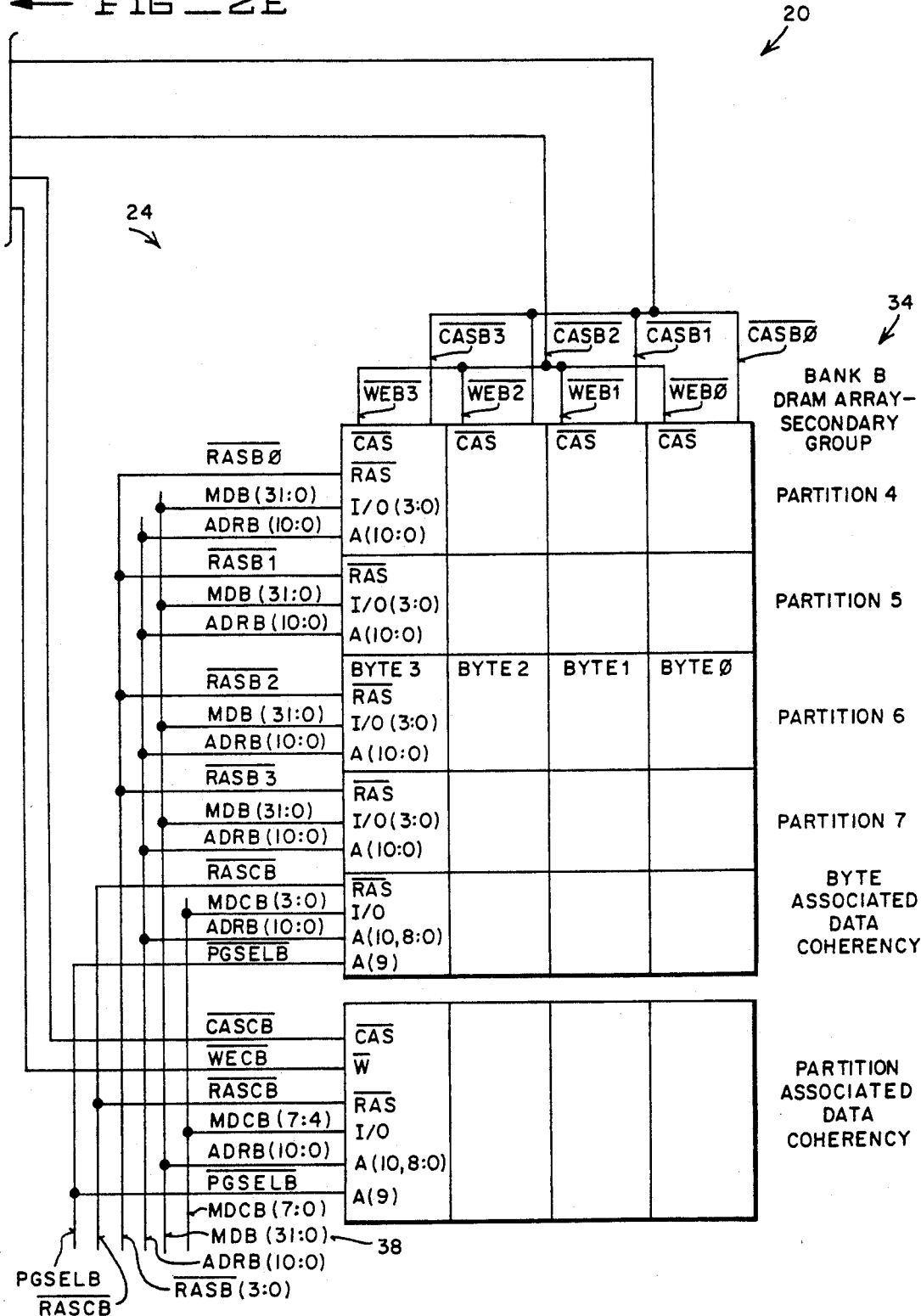

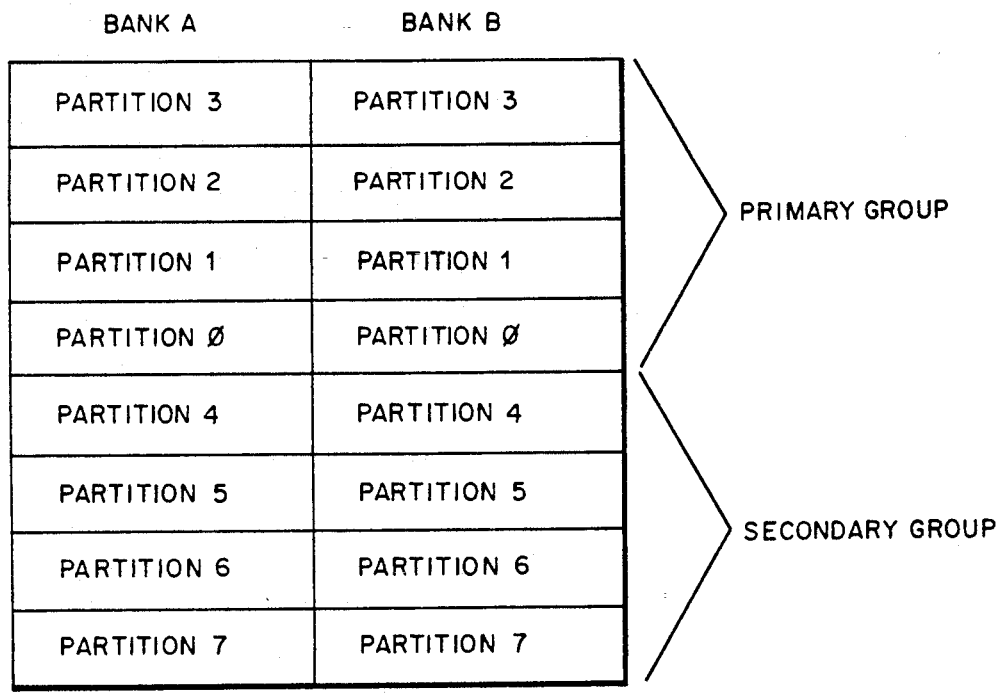
FIG_3

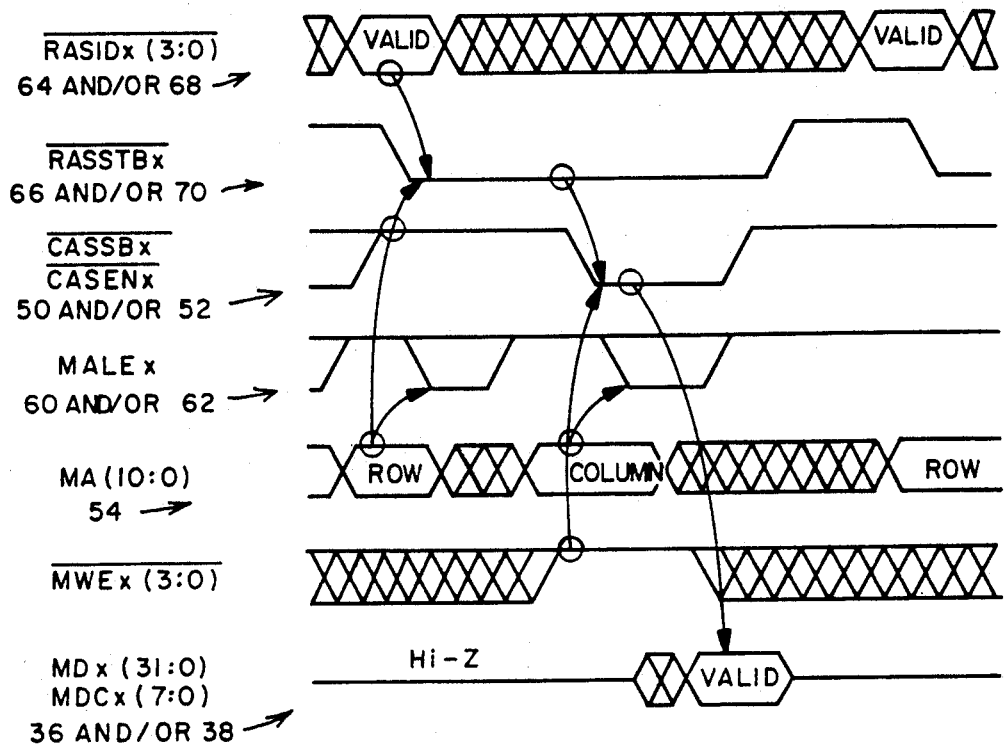
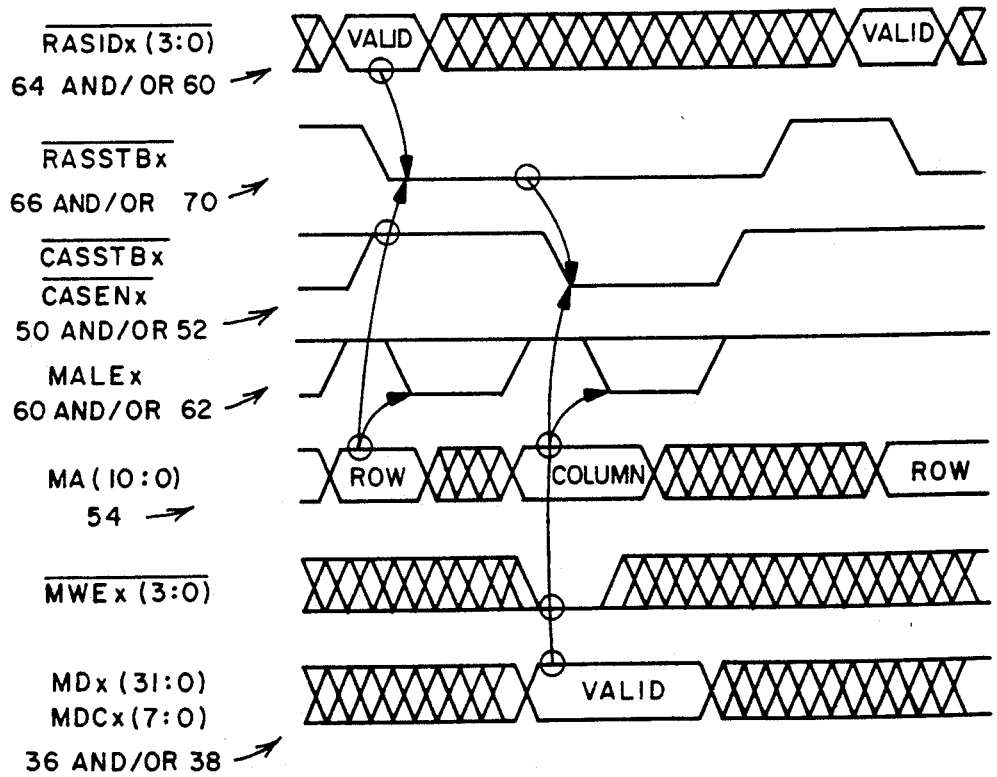

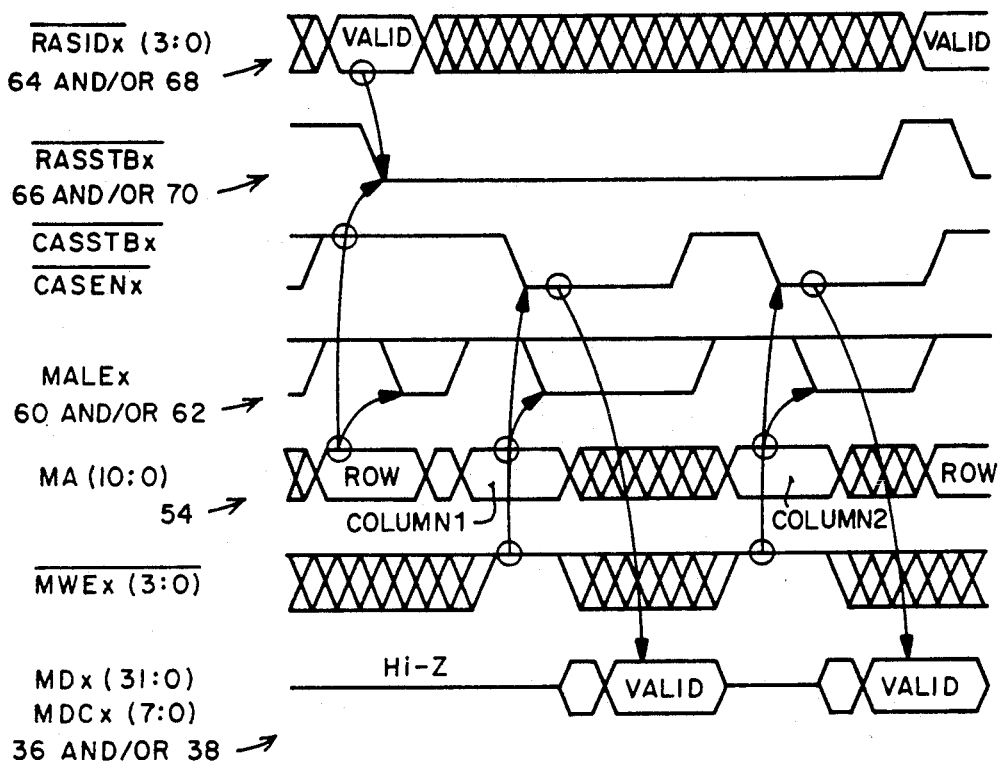
FIG_6
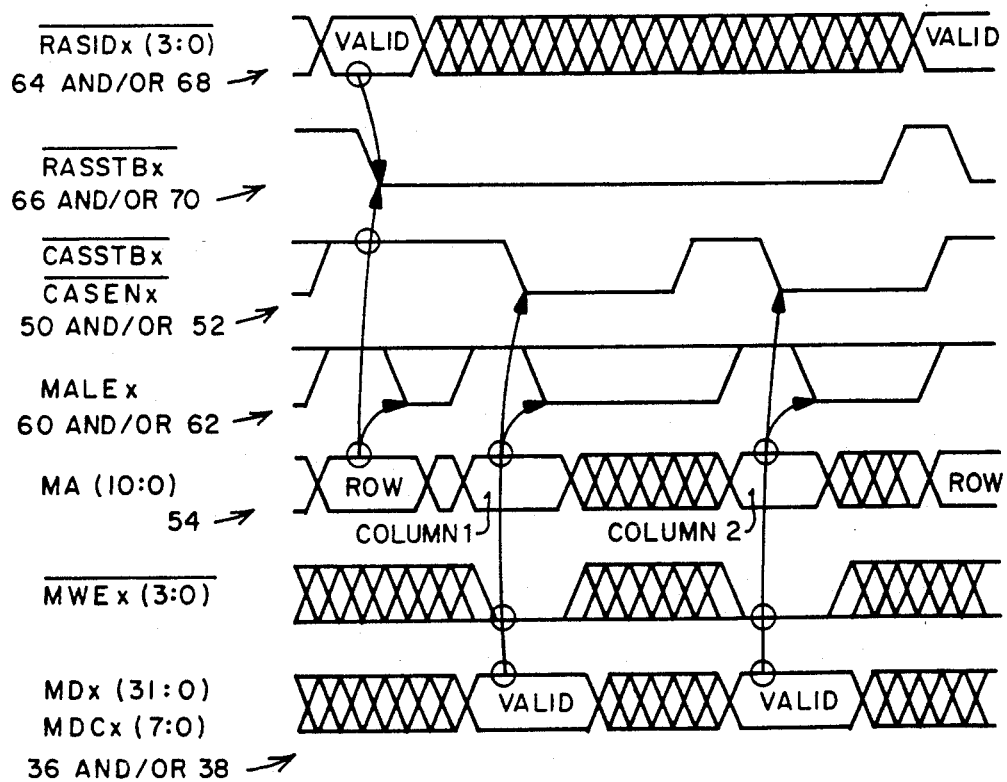
FIG_7

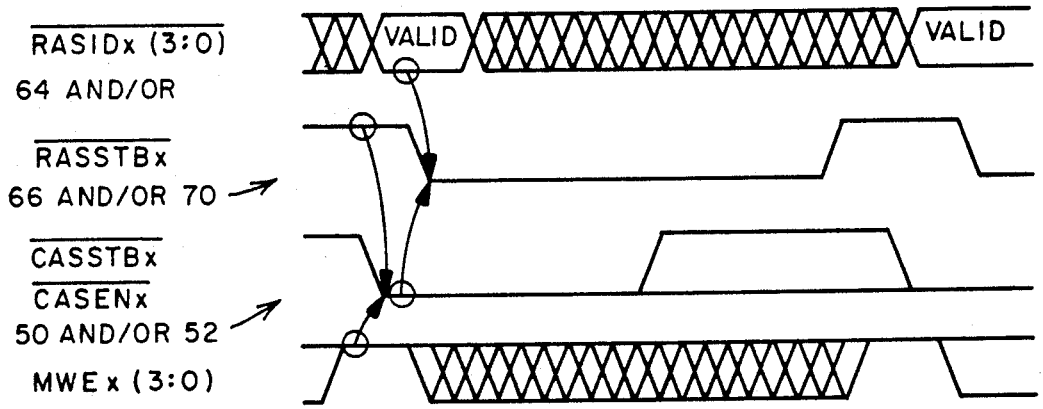
FIG_8

MAIN MEMORY DRAM INTERFACE

FIELD OF THE INVENTION

The present invention relates to a DRAM interface to a main memory. More particularly, the present invention pertains to a DRAM interface for a main memory, which is optimized for data bursting reads and writes.

BACKGROUND OF THE INVENTION

The advent of new, faster microprocessors, such as Intel's i486 brand microprocessor, have not immediately resulted in improved computer performance. This is because the performance enhancement from the faster microprocessor execution time is limited by the percentage of the time the microprocessor is allowed to complete a cycle without incurring many waitstates. Prior main memories used in conjunction with microprocessors have been a cause of this performance limitation. Pipelining increases microprocessor throughput, but main memory design constraints require latching of main memory addresses, write enable signals, etc. This additional signal setup contributes to increased main memory access times and hold timing requirements. Signal skew also contributes to increased main memory access time. If the access time for the main memory is greater than the microprocessor minimum cycle duration then wait states must be added to microprocessors memory accesses, degrading system performance.

Arrays of dynamic random access memories (DRAMS) are commonly used as main memories in computer systems. The demanding set-up and hold-times associated with DRAMs frequently prevents computer systems from realizing the greatest performance possible given the chosen microprocessor. For example, Intel's i486 microprocessor is capable of performing four consecutive 32-bit reads; however, prior DRAM main memories could not support such data bursting without complex interface circuitry.

A disadvantage of the prior art is that individual DRAM access strobes and address signals must be buffered to ensure signal integrity.

A disadvantage of the prior art is that control logic is necessary to select and control several DRAM partitions in a large DRAM array.

Another disadvantage of the prior art is that skew between signals must be tightly controlled to ensure reliable operation at or near DRAM minimum access times. Tight control of signal skew required expensive high speed logic devices or expensive application specific integrated circuits.

Another disadvantage of prior DRAM main memories is that address signals may not change prior to meeting DRAM address hold times.

Yet another disadvantage of prior DRAM main memories is that as DRAM arrays increase in size the number of signals required to interface with the array become prohibitive. This is because separate address lines, RAS lines, CAS lines, write enable lines and data lines are typically needed for each partition within the array.

SUMMARY OF THE INVENTION

An interface is described for a memory array including a multiplicity of DRAMs organized as two groups each containing two banks, each bank including multiple partitions providing data storage and data coherency storage. The interface includes a RAS controller and a CAS controller. The RAS controller resides on a first single semiconductor substrate and may be implemented using common programmable logic devices. The RAS controller receives associated signals and generates data RAS signals and data coherency RAS signals. The data RAS signals have a minimum skew with respect to each other and to said data coherency RAS signals. The CAS controller resides on a second semiconductor substrate and may also be implemented using standard programmable logic devices. The CAS controller receives latches memory array write enables, as well as column access strobe signals. The CAS controller generates byte CAS signals and a multiplicity of byte write enable signals for the partition. The byte CAS signals have a minimum skew with respect to each other and to the byte write enable signals. Thus, the interface reduces the access time of the memory array.

It is an object of the present invention to provide a simple interface for a large DRAM memory array.

It is an object of the present invention to allow pipelined accesses between DRAM memory banks.

It is another object of the present invention to provide a flexible memory interface capable of supporting a variety of DRAM technologies and memory capacities.

It is still a further object of the present invention to provide an interface that is simple and inexpensive to produce.

It is a still further object of the present invention to provide an interface which does not require buffering of row access strobes, column access strobes, addresses, or write enables.

It is another object of the present invention to provide an interface that does not need to be modified as memory array technology is updated.

It is a yet another object of the present invention to provide an optimized mechanical interface.

Another object of the present invention is to provide a main memory whose access time is limited only by the access time of the particular DRAM technology that the interface supports.

Another object of the present invention is to provide an interface which allows addresses and write enables to change prior to meeting DRAM address or write enable hold times respectively.

Other objects, features, and advantages of the present invention will be apparent from the accompanying drawings and the detailed description that follows.

BRIEF DESCRIPTION OF THE DRAWINGS

The present invention is illustrated by way of example and not limitation in the figures of the accompanying drawings in which references indicate similar elements and in which:

FIG. 1 is a block diagram of a system incorporating a main memory;

FIGS. 2A, 2B, 2C, 2D, 2E and 2F are schematic diagrams of a main memory;

FIG. 3 is a block diagram of memory array organization;

FIG. 4 is a signal relationship diagram for a standard read cycle;

FIG. 5 is a signal relationship diagram for a standard write cycle;

FIG. 6 is a signal relationship diagram for a burst read cycle;

FIG. 7 is a signal relationship diagram for a burst write cycle;

FIG. 8 is a signal relationship diagram for a refresh cycle.

DETAILED DESCRIPTION OF THE PREFERRED EMBODIMENT

The present invention is an interface for a DRAM main memory, which is optimized for data bursting reads and writes.

In this application, signals will be generally referred to by signal names. Particular signal names may be varied without departure from the scope and spirit of the present invention. Further, signal states will be referred to as being active or inactive, as opposed to being high or low, one or zero, true or false, etc. Signals which are active when low are indicated by a bar (XXXX). As examples of this signal naming convention, see Table 1 below:

TABLE 1

| SIGNAL NAME | ELECTRICAL NOTATION | LOGICAL NOTATION | STATE |
|---|---|---|---|
| MA0 | High | 1 or true | Active |
|  | Low | 0 or false | Inactive |
| RASSTBB | Low | 1 or true | Active |
|  | High | 0 or false | Inactive |

In describing groups of signals a decimal radix convention may be used, such as using MDA(31:0) to refer to all 32 data lines of a bus. Within each group, the least significant bit of the group is referred to with a suffix of "0". In other words, MDA0 refers to the least significant data line of the bus and MDA31 refers to the most significant data line.

FIG. 1 illustrates a system incorporating main memory 20. Microprocessor interface 998 resides between microprocessor 999 and main memory 20, and controls main memory 20. Information is passed between microprocessor interface 998 and main memory 20 via bus 997. As will be described in detail below, main memory 20 includes array interface 22 and DRAM memory array 24.

Main memory 20 is optimized to operate with a microprocessor 999 organized on cache lines, such as Intel's i486 brand microprocessor. To support these microprocessors main memory 20 performs cache-line, or burst, read and write data transfers. In other words, main memory 20 can read or write multiple data items in response to a single address. Microprocessor 999 accesses 16 bytes of sequential data at a time and has a 32 bit interface. Thus, main memory 20 will perform four 32-bit reads, 16 bytes, in response to a single memory read request from microprocessor interface 998. Main memory 20 can perform burst reads and burst writes because the next address required by microprocessor 999 can be predicted, which permits address pipelining. For the purpose of this specification, burst reads and burst writes refer to cycles during which more than one data item, e.g. a byte, a word, or double word, is accessed from consecutive memory locations.

Main memory 20 differs from prior main memories in its ability to provide an Intel i486 brand microprocessor based system with optimal memory performance with minimal support logic. Main memory 20 provides an intelligent interface for microprocessors capable of bursting read data by allowing independent address and write enable latching, which permits a pipelined memory protocol that removes the requirement for meeting the special DRAM timing parameters required with past memory interfaces.

Main memory 20 also differs from prior main memories in the simplicity of its interface 22. This simplicity significantly decreases the performance penalties normally incurred when DRAMs are arranged in large arrays. The access time of main memory 20 is not limited by interface logic and buffers, but by the data access time of the particular DRAM technology used in array 24. As a result, main memory 20 yields the maximum performance a DRAM technology can yield.

As can be seen in FIGS. 2A, 2B, 2C, 2D, 2E, and 2F, main memory 20 includes a number of DRAM partitions, yet appears logically to microprocessor 999 as a single DRAM partition with enhanced performance and memory capacity. Main memory 20 simplifies the design of microprocessor interface 998 by generating individual access strobes, selecting DRAM partitions, and controlling signal skew. In addition, main memory 20 streamlines the protocol required for standard DRAM accesses by allowing pipe-lined data, addresses, control signal, and partition select signals, which significantly decreases the inherent timing penalties incurred when DRAMs are arranged in large arrays. Main memory 20 supports standard memory read and write cycles, fast page read and fast page write cycles, and CAS-before-RAS refresh cycles.

In addition to providing enhanced performance, main memory provides an optimal mechanical configuration for a single board computer. In the preferred embodiment main memory 20 is implemented on two double sided memory modules. Each double sided module carries a maximum of 40 DRAMs per side. Main memory 20 may be realized in other mechanical configurations without effecting the function described herein.

Unlike prior SIMMs or discrete memory arrays, main memory 20 does not require a separate data path, address path and control path for each partition within memory array 20. Main memory supports up to 16 DRAM partitions using a single 150 pin connector without additional interface logic or signals. The pin-out of the connector is shown in Table 2. The number of power and ground pins is sufficient for up to 160 DRAM configuration.

TABLE 2

| 1 | 0V | 51 | 0V | 101 | CASENB |
|---|---|---|---|---|---|
| 2 | MDB31 | 52 | MDB15 | 102 | CASSTBB |
| 3 | MDB30 | 53 | MDB14 | 103 | 0V |
| 4 | MDB29 | 54 | MDB13 | 104 | MWEB3 |
| 5 | MDB28 | 55 | MDB12 | 105 | MWEB2 |
| 6 | MDB27 | 56 | MDB11 | 106 | MWEB1 |
| 7 | MDB26 | 57 | MDB10 | 107 | MWEB0 |
| 8 | MDB25 | 58 | MDB9 | 108 | MMLOC |
| 9 | MDB24 | 59 | MDB8 | 109 | MID3 |
| 10 | MDCB3 | 60 | MDCB1 | 110 | MID7 |
| 11 | +5V | 61 | +5V | 111 | MID2 |
| 12 | MDCB7 | 62 | MDCB5 | 112 | MID6 |
| 13 | 0V | 63 | 0V | 113 | MID1 |
| 14 | MDB23 | 64 | MDB7 | 114 | MID5 |
| 15 | MDB22 | 65 | MDB6 | 115 | MID0 |
| 16 | MDB21 | 66 | MDB5 | 116 | MID4 |
| 17 | MDB20 | 67 | MDB4 | 117 | +5V |
| 18 | MDB19 | 68 | MDB3 | 118 | MALEB |
| 19 | MDB18 | 69 | MDB2 | 119 | MA10 |
| 20 | MDB17 | 70 | MDB1 | 120 | MA9 |
| 21 | MDB16 | 71 | MDB0 | 121 | MA8 |

TABLE 2-continued

| | | | | | |
|---|---|---|---|---|---|
| 22 | MDCB2 | 72 | MDCB0 | 122 | MA7 |
| 23 | +5V | 73 | +5V | 123 | MA6 |
| 24 | MDCB6 | 74 | MDCB4 | 124 | MA5 |
| 25 | 0V | 75 | 0V | 125 | MA4 |
| 26 | MDA31 | 76 | MDA15 | 126 | MA3 |
| 27 | MDA30 | 77 | MDA14 | 127 | MA2 |
| 28 | MDA29 | 78 | MDA13 | 128 | MA1 |
| 29 | MDA28 | 79 | MDA12 | 129 | MA0 |
| 30 | MDA27 | 80 | MDA11 | 130 | MALEA |
| 31 | MDA26 | 81 | MDA10 | 131 | 0V |
| 32 | MDA25 | 82 | MDA9 | 132 | $\overline{\text{RASSTBB}}$ |
| 33 | MDA24 | 83 | MDA8 | 133 | $\overline{\text{RASIDB3}}$ |
| 34 | MDCA3 | 84 | MDCA1 | 134 | $\overline{\text{RASIDB2}}$ |
| 35 | +5V | 85 | +5V | 135 | $\overline{\text{RASIDB1}}$ |
| 36 | MDCA7 | 86 | MDCA5 | 136 | $\overline{\text{RASIDB0}}$ |
| 37 | 0V | 87 | 0V | 137 | +5V |
| 38 | MDA23 | 88 | MDA7 | 138 | $\overline{\text{RASIDA3}}$ |
| 39 | MDA22 | 89 | MDA6 | 139 | $\overline{\text{RASIDA2}}$ |
| 40 | MDA21 | 90 | MDA5 | 140 | $\overline{\text{RASIDA1}}$ |
| 41 | MDA20 | 91 | MDA4 | 141 | $\overline{\text{RASIDA0}}$ |
| 42 | MDA19 | 92 | MDA3 | 142 | $\overline{\text{RASSTBA}}$ |
| 43 | MDA18 | 93 | MDA2 | 143 | +5 |
| 44 | MDA17 | 94 | MDA1 | 144 | $\overline{\text{MWEA3}}$ |
| 45 | MDA16 | 95 | MDA0 | 145 | $\overline{\text{MWEA2}}$ |
| 46 | MDCA2 | 96 | MDCA0 | 146 | $\overline{\text{MWEA1}}$ |
| 47 | +5V | 97 | +5V | 147 | $\overline{\text{MWEA0}}$ |
| 48 | MDCA6 | 98 | MDCA4 | 148 | 0V |
| 49 | 0V | 99 | 0V | 149 | $\overline{\text{CASSTBA}}$ |
| 50 | 0V | 100 | 0V | 150 | $\overline{\text{CASENA}}$ |

The signals described in Table 2 will be explained in detail later.

As can be seen in FIGS. 2A, 2B, 2C, 2D, 2E and 2F, main memory 20 includes two groups, designated primary group and secondry group. Each group includes a memory array organized as two interleaved DRAM banks. Each group also includes an array interface 22 that utilizes address latches 26, RAS controller 28, CAS controller 30 and memory identifier 29. RAS controller 28 generates row address strobes signals by encoding partition select signals. RAS controller also latches partition select signals. CAS controller 30 generates column address strobe signals and write enables for memory array 24. RAS controller 28 and CAS controller 30 are each implemented using standard programmable logic devices, which reduces implementation costs.

In the preferred embodiment, both memory arrays 24 together include 160 DRAMS, which provide both data storage and data coherency storage. Memory arrays 24 may also be realized using an arbitrary number of DRAMS. The capacity of memory arrays 24 depends upon the memory technology utilized and the number of DRAM groups utilized. Main memory 20 can support three different DRAM technologies: 1 megabit, 4 megabit and 16 megabit. This allows memory array 24 to provide memory capacities from 2 megabytes up to 256 megabytes. Two megabytes of memory is achieved using 1 megabit technology. Two hundred fifty-six megabytes of memory are achieved by two DRAM groups, each carrying 16 megabit technology. A given DRAM group utilizes only one DRAM technology. Two DRAM groups, each carrying different technologies, may operate together.

Regardless of technology utilized by a memory module, data storage DRAMs are always implemented in by-four DRAMS, and data coherency storage in by-one DRAMS.

Memory arrays 24 may be configured as one 64-bit wide bank or two interleaved 32-bit wide banks, bank A and bank B. Simply tying together bank A and bank B input signals configures memory array 24 as a single bank. Memory arrays are configured as two banks when bank A and bank B input signals are driven independently.

Memory arrays 24 are organized as 32 bit wide partitions. The number of partitions available depends upon the number of DRAMs used. FIG. 3 illustrates the organization of memory array when configured as two groups, each including two interleaved banks. Each bank shown includes eight partitions per DRAM group. Each partition is organized on 8-bit boundaries to allow the updating of individual bytes within a partition.

Each memory array 24 utilizes two 32-bit wide data buses, one for each bank. Data signals MDA(31:0), 36 and MDB(31:0) 38, output on these buses are not buffered prior to their connection to memory array 24. MDA(31:0) 36 is written into bank A 32 on the active going edge of $\overline{\text{CASSTBA}}$ 50 or $\overline{\text{CASENA}}$ whichever is activated later, provided that its associated byte write enable, $\overline{\text{MWEA}}$ (3:0), is active when $\overline{\text{CASSTBA}}$ 50 or $\overline{\text{CASENA}}$ goes active. MDB(31:0) 38 is whiten into bank B 34 under similar circumstances using $\overline{\text{CASSTBB}}$ 52, $\overline{\text{CASENB}}$ and MWEB(3:0). The data bits associated with each write enable are described in Table 3.

TABLE 3

| MEMORY WRITE ENABLES | ASSOCIATED DATA |
|---|---|
| $\overline{\text{MWEA3}}$ | Write Enable for MDA(32:24),MDCA3 |
| $\overline{\text{MWEA2}}$ | Write Enable for MDA(23:16),MDCA2 |
| $\overline{\text{MWEA1}}$ | Write Enable for MDA(15:8),MDCA1 |
| $\overline{\text{MWEA0}}$ | Write Enable for MDA(7:0),MDCA0 |
| $\overline{\text{MWEB3}}$ | Write Enable for MDB(31:24),MDCB3 |
| $\overline{\text{MWEB2}}$ | Write Enable for MDB(23:16),MDCB2 |
| $\overline{\text{MWEB1}}$ | Write Enable for MDB(15:8),MDCB1 |
| $\overline{\text{MWEB0}}$ | Write Enable for MDB(7:0),MDCB0 |

Each memory array 24 provides several different data coherency options. Memory arrays 24 may be configured to support parity on byte boundaries or error correction codes (ECC) on 32 bit, or 64 bit, boundaries. These options are available regardless of the DRAM technology used.

Data coherency storage is provided by sixteen data coherency DRAMs, which generate two 8-bit wide data coherency buses, MDCA(7:0) and MDCB(7:0). These signals are not buffered prior to their connection to memory array 24. The data coherency bits provided are shown in Table 4.

TABLE 4

| Data Coherency Bits | Associated Data |
|---|---|
| MDCA (7:4) | Data Coherency bit for MDA (31:0) |
| MDCA3 | Data Coherency bit for MDA (31:24) |
| MDCA2 | Data Coherency bit for MDA 23:16) |
| MDCA1 | Data Coherency bit for MDA15:8) |
| MDCA0 | Data Coherency bit for MDA (7:0) |
| MDCB (7:4) | Data Coherency bit for MDB (31:0) |
| MDCB3 | Data Coherency bit for MDB (31:24) |
| MDCB2 | Data Coherency bit for MDB (23:16) |
| MDCB1 | Data Coherency bit for MDB (15:8) |
| MDCB0 | Data Coherency bit for MDB (7:0) |

Data coherency bits MDCA(3:0) and MDCB(3:0) are written into a memory array 24 on the active going edge of their associated column access strobe, provided their associated byte write enable is active as the column access strobe goes active. In contrast, MDCA(7:4) are not associated with any particular byte but only with a particular partition. Thus, partition specific MDCA(7:4) are both written to if any write enable, $\overline{MWEA}$ (3:0), is active when $\overline{CASSTBA}$ 50 and $\overline{CASENA}$ are activated. Similarly, partition specific MDCB(7:4) are written to if any write enable, $\overline{MWEB}$ (3:0), is active when $\overline{CASSTBA}$ 52 and $\overline{CASENB}$ are both activated.

Parity checking is supported by providing 1 data coherency bit per byte. The data coherency bits are realized using by-one DRAMS, using the same technology as used for data storage DRAMS. This ensures that data coherency DRAMs are available at the same access speed as that of the data storage DRAMS. Four data coherency bits are provided for each bank per DRAM group, one bit for each byte in a partition. Additionally, four data coherency bits are associated with each bank. When the non-byte specific data coherency bits are combined with the four-byte specific data coherency bits, main memory 20 supports error correction and detection per DRAM group. Further, one data coherency bit is available for use as a dirty bit. As a result of the data coherency bits, each bank is actually 40 bits wide.

Error correction codes are supported for the DRAM bank data-bus width, i.e. 32 bit boundaries, or 64-bit boundaries when main memory is configured as a single bank, rather than for individual bytes. Memory array 24 supports two bit error detection and one bit error correction for each bank using MDCA(6:0) and MDCB(6:0). Because MDCA(7) and MDCB(7) are not associated with any particular byte these bits may be used as dirty bits. Dirty bits may be used when a non-32-bit write (or other ECC associated width) is performed and the ECC bits are not updated. The ECC bits may be updated later when the bus is idle or during non-critical code execution. The dirty bits allow main memory to perform non-ECC data width bit writes without paying the penalty of first reading the data, updating one or several bytes, generating a new ECC data, and writing the data and the new ECC into memory.

Each group interface utilizes a memory identifier 29 to aid microprocessor interface 998 in controlling main memory 20. Memory identifiers 29 generate memory identification signals MID(7:0), which identify the memory capacity of the group. The encoding of MID(7:0) is indicated in Table 5. MID(3:0) are associated with the primary group and MID(7:4) are associated with the secondary group.

TABLE 5

| MID7 MID3 | MID6 MID2 | MID5 MID1 | MID4 MID0 | MEMORY MODULE CAPACITY | DRAM TECH- NOLOGY |
|---|---|---|---|---|---|
| 0 | 0 | 0 | 0 | 2 Mega Byte | 1 MBit |
| 0 | 0 | 0 | 1 | 4 Mega Byte | 1 MBit |
| 0 | 0 | 1 | 0 | 6 Mega Byte | 1 MBit |
| 0 | 0 | 1 | 1 | 8 Mega Byte | 1 MBit |
| 0 | 1 | 0 | 0 | 8 Mega Byte | 4 MBit |
| 0 | 1 | 0 | 1 | 16 Mega Byte | 4 MBit |
| 0 | 1 | 1 | 0 | 24 Mega Byte | 4 MBit |
| 0 | 1 | 1 | 1 | 32 Mega Byte | 4 MBit |
| 1 | 0 | 0 | 0 | 32 Mega Byte | 16 MBit |
| 1 | 0 | 0 | 1 | 64 Mega Byte | 16 MBit |
| 1 | 0 | 1 | 0 | 96 Mega Byte | 16 MBit |
| 1 | 0 | 1 | 1 | 128 Mega Byte | 16 MBit |
| 1 | 1 | 0 | 0 | Undefined | |
| 1 | 1 | 0 | 1 | Undefined | |
| 1 | 1 | 1 | 0 | Undefined | |
| 1 | 1 | 1 | 1 | Module Not Installed | |

Memory identifiers 29 also generate a memory location signal, MMLOC 92, which indicates to the group RAS controller 30 which group the RAS controller is associated. Thus, MMLOC is a signal that varies between the primary group and the secondary group.

Each group memory array receives multiplexed row and column addresses from address latches 26, which provide temporary bank address storage. Address latches 26 are D-type, transparent non-inverting latches. One address latch 26 is used for bank A and one latch 26 for bank B, per DRAM group. Transparent latches 26 allow overlapped accesses between bank A 32 and bank B 34.

Each address latch 26 receives as inputs multiplexed row/column address signals MA(10:0) 54 from bus 997. Because array interfaces 22 support many different DRAM technologies not every memory address signal will be used with every DRAM technology. For example, only MA(8:0) are needed to support 1 megabit DRAMS, while MA(10:0) are needed to support 16 megabit technology. One address latch 26 outputs ADRA(10:0) 56 to bank A 32 and another address latch 26 outputs ADRB(10:0) 58 to bank B, per two partitions in each group. The operation of address latches 26 is controlled by address latch enable signals, MALEA 60 and MALEB 62, for bank A and bank B, respectively.

Latch enable signals, MALEA 60 for bank A 32 and MALEB 62 for bank B 34, permit independent address control of bank A 32 and bank B 34. While MALEB 62 and MALEA 60 are active MA(10:0) 54 are buffered and allowed to flow through to the appropriate DRAM bank. When MALEA 60 and MALEB 62 are inactive, MA(10:0) may change because ADRA(10:0) and ADRB(10:0) are latched, allowing DRAM address setup and hold times to be met. This permits address hold times for one DRAM bank from a strobe to be met while addresses change for the other DRAM bank to allow the meeting of address set-up time. MALEA 60 and MALEB 62 also mask address skew, access strobe skew, and trace delay, which permits microprocessor interface 998 to change address signals MA(10:0) 54 prior to meeting DRAM address hold times. Thus, microprocessor interface 998 need only meet standard TTL transparent latch setup and hold times.

The primary function of RAS controllers 28 is generating row access strobes for memory array 22. Rather than selecting partitions using individual row and column access strobes, RAS controllers 28 select partitions using encoded partition select input signals, RASIDA(3:0) and RASIDB(3:0), in combination with bank A and bank B RAS strobe inputs. RAS controllers 28 select only one partition from bank A and bank B during read and write cycles and all partitions within a bank during refresh cycles. Because only one partition from each bank receives a RAS strobe during read, no data bus contention is possible between partition within a bank.

Encoded partition select input signals RASID(3:0) 64 are RASIDB(3:0) 68 may be pipelined. RASID(3:0) 64 and RASIDB(3:0) 68 may change shortly after the start of a memory access, thus, they may be generated combinatorially. Additionally, when bank RAS partition selects 66 and 68 are pipelined, additional time is available to the main memory to decode and select the next DRAM partition. Table 6 summarizes the encoding of RASIDA(3:0) 88 and RASIDB(3:0) 90, which are indicated jointly by RASIDX(3:0).

TABLE 6

| $\overline{RASIDX3}$ | $\overline{RASIDX2}$ | $\overline{RASIDX1}$ | $\overline{RASIDX0}$ | PARTITION SELECTED |
|---|---|---|---|---|
| 1 | 1 | 1 | 1 | Partition 7 of bank X |
| 1 | 1 | 1 | 0 | Partition 6 of bank X |
| 1 | 1 | 0 | 1 | Partition 5 of bank X |
| 1 | 1 | 0 | 0 | Partition 4 of bank X |
| 1 | 0 | 1 | 1 | Partition 3 of bank X |
| 1 | 0 | 1 | 0 | Partition 2 of bank X |
| 1 | 0 | 0 | 1 | Partition 1 of bank X |
| 1 | 0 | 0 | 0 | Partition 0 of bank X |
| 0 | 1 | 1 | 1 | All Partitions (Refresh) |
| 0 | 0 | x | x | No Active Partition |
| 0 | x | 0 | x | No Active Partition |
| 0 | x | x | 0 | No Active Partition |

In Table 6, "1" indicates active, "0" inactive and "x" a don't care. As before, and in general, partitions 7 through 4 are associated with the secondary group and partitions 3 through 0 are associated with the primary group.

Bank A input signals include a global row access strobe signal $\overline{RASSTBA}$ 66. The analogous bank B signal are is $\overline{RASSTBB}$ 70. RAS controller 28 inputs also include MMLOC 92. MMLOC 92 indicates to RAS controller 28 whether it is located within the primary group or secondary group.

In order to support data coherency on byte wide boundaries using the same DRAM technology for data coherency storage and data storage, special partition select signals are generated by RAS controller for data coherency DRAMS. In the preferred embodiment, four partitions are supported using a single data coherency DRAM. Therefore, data coherency DRAMS determine the selected partition using the partition select signal $\overline{PGSELX}$, which is connected to an address input pin. A single signal can be used to select among the four partitions because DRAM addresses are multiplexed. Table 7 summarizes the encoding of coherency DRAM partition selects $\overline{PGSELA}$ and $\overline{PGSELB}$.

TABLE 7

| Row Address on $\overline{PGSELX}$ | Column Address on $\overline{PGSELX}$ | Selected Partition within blank |
|---|---|---|
| 0 | 0 | 0,4 |
| 0 | 1 | 1,5 |
| 1 | 0 | 2,6 |
| 1 | 1 | 3,7 |

RAS controller 28 generates $\overline{PGSELA}$ 80 and $\overline{PGSELB}$ 82 using Equation (1), in which "+" is a logical OR, "*" is a logical AND, and a bar over a signal ($\overline{XXX}$) means the signal is not true. These conventions are used in the remaining equations.

(1) $\overline{PGSELX} = \overline{DRASX} * RASIDX1$ $+ \overline{DRASX} * RASIDX0$ $+ RASIDX1 * RASIDX0$ where:
X indicates bank A or bank B,
$\overline{DRASX}$ is a time delayed version of RASSTBX,
RASIDX0 is a memory identification signal indicating column address 9 of bank X,
RASIDX1 is a memory identification signal indicating row address 9 of bank X.
The delayed versions of $\overline{RASSTBA}$ and $\overline{RASSTBB}$, $\overline{DRASA}$ and $\overline{DRASB}$, are generated by a 15 nanosecond silicon delay element.

Equation 1 includes three terms, each of which brings $\overline{PGSELX}$ active in different situations. Two of these terms, ($\overline{DRASX} * RASIDX1$) and ($\overline{DRASX} * RASIDX0$), select bank X. The third term (RASIDX1 *RASIDX0) prevents a glitch from occurring if RASIDX0 and RASIDX1 are both active during the transition of $\overline{DRASX}$.

RAS controllers 28 use separate schemes to generate row address signals for data DRAMs and data coherency DRAMS. RAS controller 28 generate eight data DRAM RAS signals, four for each bank. Each bank requires one data DRAM RAS signal for each populated memory partition in main memory 20. RAS controllers 28 combine RASIDA(3:0) 64 and with MMLOC 92 to produce a data DRAM partition RAS signal when $\overline{RASSTBA}$ 66 is active. RAS controllers 28 generate data DRAM partition RAS signals for bank B 34 in a similar fashion. RAS controller 28 latch partition selects RASIDX(3:0) with the falling edge of $\overline{RASSTBX}$ to generate LRASIDX(3:0), which are used to generate bank partition row access strobes. RAS controller 28 generates the DRAM data RAS signals according to Equation 2.

(2) $\overline{RASX} =$

RASSTBX*LRASIDX3* $\overline{LRASIDX2}$* $\overline{LRASIDX1}$*

LRASIDX0*MMLOC

+RASSTBX*LRASIDX3*LRASIDX2* $\overline{LRASIDX1}$*

-continued $$\overline{LRASIDX0} \cdot \overline{MMLOC}$$

$+ RASSTBX \cdot \overline{LRASIDX3} \cdot LRASIDX1 \cdot LRASIDX0$ $+ RASX \cdot RASSTBX$ where:
X indicates bank A or bank B,
LRASIDX(3:0) are latched versions of RASIDX(3:0)
L in a prefix stands for a latched version of a signal;
RASIDX(3:0) are the input RAS enable signals for bank X;
RASSTBX(3:0) is the input RAS strobe for bank X.

In Equation (2) the term (RASSTBX*LRASIDX3 * $\overline{LRASIDX2}$* $\overline{LRASIDX1}$ *LRASIDX0*MMLOC) asserts RASX during a data access cycle to partition 1 within primary module. The term (RASSTBX-*LRASIDX3*LRASIDX2* $\overline{LRASIDX1}$*-LRASIDX0* $\overline{MMLOC}$) asserts RASX during a data access cycle to partition 1 within secondary module of bank X . RASX is asserted during refresh cycles for bank X by the term (RASSTBA* $\overline{LRASIDX3}$*-LRASIDX1 *LRASIDX0). The term (RASX-B*RASSTBX) latches RASX in its active state for the duration of RASTBX.

RAS controllers 28 use a different scheme to generate RAS signals for data coherency DRAMS. MMLOC 92 determines which data coherency DRAMs are selected while the bank RAS strobe is active. In other words, when MMLOC is high, data coherency DRAMs associated with the primary group are selected, and when MMLOC is low, data coherency DRAMs associated with the secondary group are selected. Bank data coherency RAS signals $\overline{RASCA}$ 84 and $\overline{RASCA}$ 86 are generated by using Equation 3.

(3) RASCX = RASSTBX*LRASIDX3* $\overline{LRASIDX2}$*MMLOC $+ RASSTBX \cdot LRASIDX3 \cdot LRASIDX2 \cdot \overline{MMLOC}$ $+ RASSTBX \cdot \overline{LRASIDX3} \cdot LRASIDX2 \cdot$

LRASIDX1*LRASIDX0

$+ RASSTBX \cdot RASCX$ where:
X indicates bank A or bank B,
LRASIDX(3:0) are latched versions of RASIDX(3:0)
RASIDX(3:0) are the RAS enable signals for bank X;
$\overline{RASSTBX}$ is the RAS strobe for bank X.

In equation 3 the term (RASSTBX* LRASIDX3* $\overline{LRASIDX2}$* MMLOC) asserts the data coherency RAS signal for bank X during a data access cycle, or primary module. Similarly, the term (RASSTBX-*LRASIDX3*LRASIDX2* $\overline{MMLOC}$) asserts bank X's data coherency RAS signal during a data access to partitions 4 through 7, or DRAM group 1. The bank X RAS signal is asserted during refresh cycles by the term (RASSTBX*LRASIDX3*LRASIDX2*LRASIDX1 *LRASIX0). RASCX is latched in its active state for the duration of RASSTBX by the term (RASSTBX-*RASCX).

RAS controllers 28 simplify the design of microprocessor interface 998 by minimizing the skew between RASA(3:0) and $\overline{RASCA}$ and between RASB(3:0) and $\overline{RASCB}$ by generating all the RAS signals for a partition on the same substrate. Also, skew is minimized between RASX(3:0) signals. The advantage of decreasing skew between these signals is that access time for each DRAM is minimized.

RAS controllers 28 are implemented as four programmable array logic (PAL) devices in the preferred embodiment. In the preferred embodiment, two RAS controllers 28 are utilized per DRAM group, one for each back ; however, a single RAS controller or several RAS controllers may be used without altering the function described herein. As long as only one RAS controller is utilized per partition, the skew minimization desired will be achieved. This is because the data RAS signals and data coherency RAS signal for each partition will be generated from the same silicon device, thus achieving minimum skew between those signals.

CAS controllers 30 generate individual column access strobes and write enables for each byte. CAS controller 30 determines the byte to be accessed by qualifying input CAS strobes, CASSTB(B:A), CASSEN(B:A) with input write enables, which correspond to individual bytes within memory array 22. This qualifying of CAS strobes output to memory array 22 prevents DRAMs not participating in a write cycle from entering into read mode by preventing the assertion of partition byte column access strobes.

CAS controllers 30 permit pipelining of input write enable signals MWE(A3:A0, B3:B0) by allowing the signals to change shortly after the active going edge of the associated column access strobe, $\overline{CASSTBA}$, $\overline{CASENA}$, $\overline{CASSTBB}$ and $\overline{CASENB}$. CAS controllers 30 latch inputs MWE(A3:A0, B3:B0) when a bank's CAS strobe and enable go active. As a result column write enable signals, MWE(A3:A0, B3:B0) must meet setup and hold times relative to the bank CAS strobe and bank CAS enable signals and not DRAM set up and hold times.

CAS controllers 30 receive two column access input signals for each bank, $\overline{CASTBX}$ and $\overline{CASENX}$. These two signals may be generated independently to allow optimal CAS control. For example, one of the signals may be asynchronously generated to satisfy the row-to-column access timing parameter of a particular DRAM technology during the first fast-page access, while the other signal is generated synchronously to control subsequent fast page accesses. When active, $\overline{CASENA}$ and $\overline{CASENB}$, along with their associated CASSTBX, signals indicate that write data for their associated bank is valid on the data bus. These signals also start CAS before RAS refresh cycles. $\overline{CASSTBX}$ are ignored by CAS controller 30 until the associated $\overline{CASENX}$ signal is also active. Further, because $\overline{CASENX}$ and $\overline{CASSTBX}$ are used within CAS controller 30, no skew or logic penalties are incurred by controlling the $\overline{CASX}$ DRAM signal using two state machines with the microprocessor interface 998.

CAS controllers 30 generate byte write enable signals for bank A and bank B using input write enable signals MWE(A3:A0, B3:B0) and $\overline{CASSTBA}$, $\overline{CASENA}$, $\overline{CASSTBB}$ and $\overline{CASENB}$ column access strobe and modules. CAS controllers 30 generate five write enable signals for each bank. The bank write enable signals include four write enable signals, one per byte and an associated data coherency bit, and one write enable signal for the bank's associated partition data coherency bit. Write enable signals for byte associated data coherency DRAMs and for data DRAMs are generated according to equation 4.

(4) $\text{WEXN} = \overline{\text{CASSTBX}} \cdot \text{MWEXN}$
$+ \overline{\text{CASENX}} \cdot \text{MWEXN}$
$+ \text{CASSTB} \cdot \text{CASENX} \cdot \text{WEXN}$
$+ \text{MWEXN} \cdot \text{WEXN};$ where:
X in a suffix indicates bank A and bank B,
N represents a byte number 0, 1, 2, 3 where 0 is the least significant
WEXN is the write enable for partition N of bank X;
MWEXN is the Nth input write enable for bank X;
CASSTBX is the CAS strobe for bank X;
CASENX is the CAS enable for partition N of bank X.

In equation 4 the term $(\overline{\text{CASSTBX}} \cdot \text{MWEXN})$ passes the input write enable signal, MWEXN, to the appropriate byte within bank X when the CAS strobe, CASSTBX, is inactive. The input write enable signal MWEXN to the appropriate byte within bank X is asserted when the bank CAS enable, CASENX, is inactive by the term $(\overline{\text{CASENX}} \cdot \text{MWEXN})$. The term (CASSTB*CASENX*WEXN) latches the write enable for row X of bank N for the duration of the $\overline{\text{CASTBBX}}$ and $\overline{\text{CASENX}}$ pulse width. The final term of equation 4, (MWEXN*WEXN), prevents glitches during the $\overline{\text{CASSTBX}}$ and $\overline{\text{CASENX}}$ transition.

CAS controllers 30 generate a write enable output signal for the data coherency DRAMs associated with each bank. The partition associated data coherency write enable output signals are not row dependent; rather, they are asserted whenever one of the bank input byte write enable signals is active. As a result, each write cycle updates all of a bank's data coherency bits, MDCX(7:4). This allows a main memory 20 user to set the dirty bit, MDCX7, during non-32 bit writes. Write enables for partition associated data coherency DRAMs are generated according to equation 5.

(5) $\text{WECX} = \overline{\text{CASCX}} \cdot \text{WRITEX}$
$+ \text{CASCX} \cdot \text{WECX}$
$+ \text{WECX} \cdot \text{WRITEX}$ where:
WRITEX=MWEX3+MWEX2+MWEX1+-MWEX0;
CASCX=CASSTBX * CASENX
X in a suffix is a placeholder for bank A or bank B,
WECX is the write enable for data coherency DRAM for bank X;
MWEX(3:0) are the input write enable signals for bank X;
CASSTBX is the CAS strobe for bank X;
CASENX is the CAS enable for row N of bank X.

In equation 5 the term $(\overline{\text{CASCX}} \cdot \text{WRITEX})$ passes WRITEX to WECX when $\overline{\text{CASSTBX}}$ or $\overline{\text{CASENX}}$ is inactive. WECX is latched for the duration of CASCX by the term (CASCX * WECX). The signal WECX is protected from glitches during the $\overline{\text{CASCX}}$ transition by the term (WECX*WRITEX).

Using array input signals and array write enables, CAS controllers 30 generate DRAM CAS signals and DRAM write enable signals. CAS controllers 30 generate two types of CAS signals for each DRAM bank. CAS controllers 30 generate four data CAS for each bank, one for each byte in each bank and byte associated data coherency bits. The generation of separate CAS signals for each byte in bank A 32 and bank B 34 allows byte write accesses. Data DRAM CAS signals for bank A 32 are CASA(3:0) and for bank B 34 are CASB(3:0). CAS controllers 30 also generate a CAS signal for the partition associated bits data coherency associated with each bank. These signals are $\overline{\text{CASCA}}$ and $\overline{\text{CASCB}}$.

Bank DRAM CAS signals are generated by combining bank CAS strobe, bank CAS enable, and bank write enables. The CAS strobe to a particular byte is dependent upon the cycle type. For read cycles, which are denoted by inactive write enable signals, every CAS strobe to the bank is driven active. During write cycles, only accessed bytes receive an active CAS signal and an active byte write enable signal. This prevents DRAMs not participating in a write from entering read mode and driving the data bus. As a result, main memory 20 data enable control logic is simplified by the use of a common data output enable and allowing no bus contention between the non-accessed DRAM bytes and write data buffers on the memory interface. Data DRAM byte CAS signals, CASA(3:0) and CASB(3:0), are generated according to equation 6.

(6) $\text{CASNX} = \text{CASSTBX} \cdot \text{CASENX} \cdot \text{WEXN}$
$+ \text{CASSTBX} \cdot \text{CASENX} \cdot \overline{\text{WEX(N-3)}} \cdot$
$\overline{\text{WEX(N-2)}} \ldots \overline{\text{WEX(N-1)}}$
$+ \text{CASXN} \cdot \text{CASTBX} \cdot \text{CASENX}$ where:
X in a suffix indicates bank A and bank B,
N represents a row number 0, 1, 2, 3;
WEXN is the write enable for row N of bank X;
CASX is the CAS strobe for bank X;
CASENX is the CAS enable for row N of bank X;
CASSTBX is the CAS strobe for bank X.

In equation 6 the term (CASSTBX*CASENX-*WEXN) assert $\overline{\text{CASNX}}$ during a write to that particular byte. The term (CASSTBX*CASENX*/WEXN* . . . ) asserts $\overline{\text{CASNX}}$ during read and refresh cycles. The third term, (CASNX*CASSTBX*CASENX), asserts $\overline{\text{CASNX}}$ for the duration of $\overline{\text{CASSTBX}}$ and $\overline{\text{CASENX}}$ pulses.

The preferred embodiment of main memory 20 incorporates partition associated data coherency DRAMS, for which CAS controllers 30 generate two additional CAS signals, one for each bank. The data coherency CAS signals are not byte dependent, but are asserted whenever a bank $\overline{\text{CASSTBX}}$ and $\overline{\text{CASENX}}$ are both active. As a result each write cycle updates the bank data coherency bits, MCX(7:4). This allows main memory users to update only the bank dirty bit MDCX7 during non-data item, write or update the ECC code at a later time. Bank data coherency DRAM CAS signals are generated according to equation 7.

$\text{CASCX} = \text{CASSTBX} \cdot \text{CASENX}$ (7)

where:
X in a suffix is a placeholder for bank A or bank B,
CASCX is the data coherency CAS strobe for bank X;
CASENX is the CAS enable for bank X;
CASSTBX is the CAS strobe for bank X.

Equation 7 asserts CASCX during an access to that particular bank.

CAS controllers 30 are realized as PALs are in the preferred embodiment. Like RAS controllers 28, CAS controllers 30 are realized in the preferred embodiment using standard programmable logic devices. In the preferred embodiment, one CAS controller 30 is utilized for data and byte associated coherency DRAMS; however, a single CAS controller 30 or several CAS controllers may be used without altering the function described. However, to achieve skew minimization all CAS and write enable signals for a partition must be generated by the same CAS controller. This is because the generation of these signals on the same silicon substrate minimizes the skew between partition CAS and write enable signals, thereby decreasing DRAM access time.

Together memory arrays 22, RAS controllers 28, CAS controllers 30 and address latches 26 support most standard fast-page DRAM cycles, including standard read and early write cycles, fast page read and write cycles, and CAS before RAS refreshes. Main memory 22 does not support read-modify-writes.

The signal relationship diagrams of FIGS. 4 through 8 explain the operation of main memory 20. In FIG. 4 through 8, the arrows connecting signals indicate signal relationships or requirements.

In FIGS. 4 through 8 signal names ending in X refer to both bank A and bank B. Thus, in FIG. 3 while only MDX(31:0) is shown becoming valid it will be understood that either MDA(31:0) or MDB(31:0), or both will become valid depending upon the configuration of memory array. If configured as a single bank, both MDA(31:0) and MDB(31:0) will become active.

FIG. 4 is a signal relationship diagram for standard read for both bank A and bank B. A standard read begins when valid RASIDX(3:0) 64 and/or 68 are driven to main memory 20 along with valid addresses on MA(10:0) 54 while MALEX is active. While RASIDX(3:0) 64 and/or 68 and MA(10:0) 54 are valid, $\overline{\text{RASSTBX}}$ 66 and/or 70 is activated while $\overline{\text{CASSTBX}}$ and $\overline{\text{CASENX}}$ are held inactive. RASSTBX remains active low until the read cycle ends.

When MALEX is driven inactive, address latch 26 latches MA(10:0) and allows MA(10:0) 54 to change without affecting ADRX(10:0).

Address latch enable MALEX 60 or 62 must be driven active before the row addresses on MA(10:0) are permitted to change to a column addresses. When MALEX is driven active, address latch 26 allows column addresses to flow through to DRAMS.

Next, the column address on MA(10:0) 54 and the inactive write enables MWEX(3:0) are driven to array interface while the byte write enables are inactive. Bank column access strobes $\overline{\text{CASSTBX}}$ and bank column access enables $\overline{\text{CASENX}}$ are asserted to start the read access and place the DRAMs in read mode. The column address on MA(10:0) may be latched at the DRAMs with CASX(3:0) or latched at latches 26 with MALEX. The use of MALEX to latch column address reduces the address hold MA(10:0) times at the array interface.

After $\overline{\text{CASSTBX}}$ and $\overline{\text{CASENX}}$ are driven active, memory array 22 outputs valid data to microprocessor interface 998 via MDX(31:0) and MDCX(7:0).

FIG. 5 is a signal relationship diagram for a standard write. As with the standard read, the cycle begins when valid RASIDX(3:0) 64 and/or 68 are driven to array interface with row addresses on MA(10:0) 54. While RASIDX(3:0) 64 and/or 68 and MA(10:0) 54 are valid, $\overline{\text{RASSTBX}}$ 66 and 70 is asserted while $\overline{\text{CASTBX}}$ and $\overline{\text{CASENX}}$ are held inactive.

When MALEX is driven inactive, address latch 26 latches MA(10:0) and allows MA(10:0) 54 to change without affecting ADRX(10:0).

Address latch enable MALEX 60 or 62 must be driven active before the row addresses on MA(10:0) are permitted to change to a column addresses. When MALEX is driven active, address latch 26 allows column addresses to flow through to DRAMS.

Next the column addresses on MA(10:0) 54 and data are driven into array interface, along with appropriate write enables. Bank column address strobe enables $\overline{\text{CASSTBX}}$ and $\overline{\text{CASENX}}$ are activated to start the write cycle and strobe data into the DRAMS.

The signal relationships for a fast page read cycle are shown in FIG. 6. The cycle begins when RASIDX(3:0) 64 and/or 68 are asserted with valid row addresses on MA(10:0) 54. While RASIDX(3:0) 64 and/or 68 and MA(10:0) 54 are valid, $\overline{\text{RASSTBX}}$ 66 and/or 70 are asserted while CASTBX and CASENX are held inactive. RASSTBX remains asserted until the fast-page read cycle ends.

When MALEX is driven inactive, address latch 26 latches MA(10:0) and allows MA(10:0) 54 to change without affecting ADRX(10:0)

Address latch enables MALEA 60 and/or MALEB 62 must be driven active before the row addresses on MA(10:0) 54 can change to column addresses. When MALEA 60 and/or MALEB 62 are active, address latch 26 passes onto the next array addresses.

Next the column addresses are driven into array interface on MA(10:0) 54. While the column addresses are valid, DRAM bank column access strobe CASSTBX and column access enable CASENX are driven active to place the DRAMs in read mode.

Following activation of $\overline{\text{CASSTBX}}$ and $\overline{\text{CASENX}}$ main memory 20 drives the first set of data to microprocessor interface 998 via MDX(31:0) and MDCX(7:0). Microprocessor interface 998 places the first set of data in the proper format for microprocessor 999. While memory array is outputting the first set of data $\overline{\text{CASSTBX}}$ and $\overline{\text{CASENX}}$ are driven inactive and MDX(31:0) and MDCX(7:0) return to a high impedance state.

Address latch enable MALEX 60 or 62 must be driven active before the row addresses on MA(10:0) are permitted to change to a column addresses. When MALEX is driven active, address latch 26 allows column addresses to flow through to DRAMS.

While $\overline{\text{RASSTBX}}$ remains active, the second column address for the next read cycle is driven. Shortly thereafter, $\overline{\text{CASSTBX}}$ and $\overline{\text{CASENX}}$ are driven active starting the next read cycle.

The next set of data is output to microprocessor interface 998 via MDX(31:0) and MCDX(7:0). Again, the proper formatting of the data for microprocessor 999 is handled by microprocessor interface 998.

The signal relationships for burst writes are illustrated in FIG. 7. The cycle begins when RASIDX(3:0) 64 and/or 68 are asserted with valid row address on MA(10:0) 54. While RASIDX(3:0) 64 and/or 68 and MA(10:0) 54 are valid, $\overline{\text{RASSTBX}}$ 66 and/or 70 are both driven active while $\overline{\text{CASTBX}}$ and $\overline{\text{CASENX}}$ are held inactive. $\overline{\text{RASSTBX}}$ remains active until the fast-page write cycle ends.

Address latch enables MALEX 60 and/or 62 driven active to allow the row addresses on MA(10:0) to change to column addresses.

Next, $\overline{\text{CASSTBX}}$ and $\overline{\text{CASENX}}$ are driven active, allowing valid data to be written into bank A and/or B. While the first column address is valid, MALEX is asserted, latching ADRX(10:0).

In anticipation of the next write cycle, $\overline{\text{CASSTBX}}$ and $\overline{\text{CASENX}}$ are driven inactive.

Address latch enable MALEX 60 or 62 must be driven active before the row addresses on MA(10:0) are permitted to change to a column addresses. When MALEX is driven active, address latch 26 allows column addresses to flow through to DRAMS.

The second write cycle begins with the assertion of MDX(31:0), MDCX(7:0), MWEX, and the second column address on MA(10:0). When the write data is valid, $\overline{\text{CASSTBX}}$ and $\overline{\text{CASENX}}$ are driven active, allowing the second set of data bits to be written to bank A and/or B.

Main memory 20 supports CAS-before-RAS refresh cycles. During refresh cycles the writer enable signals, $\overline{\text{MWEX}}$(3:0) must not be active prior to $\overline{\text{CASSTBX}}$ and $\overline{\text{CASENX}}$ becoming active. If any write enables are active, CAS is driven only to the DRAMS that have active byte enable signals.

FIG. 8 is a signal relationship diagram for refresh cycles, which are performed using internal DRAM refresh control logic. The DRAMs keep track of which row was refreshed last. Thus, array interface need only present the DRAMs with cas-then-ras strobes, and need not generate row addresses for MA(10:0).

Thus, a main memory interface supporting burst reads and burst writes has been described.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. An interface for a memory array including a multiplicity of DRAMs organized as a partition providing data storage and data coherency storage, said interface comprising:
   a) a RAS controller residing on a first semiconductor substrate, said RAS controller receiving a RAS strobe signal, said RAS controller generating a data RAS signal and a data coherency RAS signal, said data RAS signal having a minimum skew with respect to said data coherency RAS signal for reducing access time of said DRAMs; and
   b) a CAS controller residing on a second semiconductor substrate, said CAS controller receiving a memory array write enable signal and a CAS strobe signal, said CAS controller generating a multiplicity of byte CAS signals and a multiplicity of byte write enable signals for said partition, said multiplicity of byte CAS signals having a minimum skew with respect to said multiplicity of byte write enable signals for reducing access time of said DRAMs.

2. The interface of claim 1 wherein said CAS controller latches said multiplicity of byte write enable signals.

3. The interface of claim 1 further comprising a latch for receiving memory array address signals and providing partition address signals.

4. The interface of claim 1 wherein data coherency is supported on byte boundaries.

5. The interface of claim 1 wherein data coherency is supported on partition boundaries.

6. The interface of claim 1 wherein said data storage is implemented using by-four DRAMs and said data coherency storage is implemented using by-one DRAMS.

7. The interface of claim 6 where in said multiplicity of DRAMs are all of one technology.

8. An interface for a memory array including a multiplicity of DRAMs organized as a first multiplicity of partitions, each partition including data storage and data coherency storage, each of said partitions including a second multiplicity of bytes, said interface comprising:
   a) a RAS controller residing on a first semiconductor substrate, said RAS controller receiving a RAS strobe signals and partition select signals for selecting one of said first multiplicity of partitions, said RAS controller generating a data RAS signal and an associated data coherency RAS signal for a selected partition, said data RAS signal having a minimum skew with respect to said associated data coherency signal for reducing access time of said DRAMs; and
   b) a CAS controller residing on a second semiconductor substrate, said CAS controller receiving a first multiplicity of partition write enable signals and receiving a CAS strobe signal, said CAS controller generating a second multiplicity of byte CAS signals and a second multiplicity of byte write enable signals for said selected partition, said byte CAS signals having a minimum skew with respect to said byte write enable signals for reducing access time of said DRAMs.

9. The interface of claim 8 wherein said CAS controller latches said first multiplicity of partition write enable signals.

10. The interface of claim 8 further comprising a latch for receiving memory array address signals and providing partition address signals.

11. The interface of claim 8 wherein data coherency is supported on byte boundaries.

12. The interface of claim 8 wherein data coherency is supported on partition boundaries.

13. The interface of claim 8 wherein said data storage is implemented using by-four DRAMs and said data coherency storage is implemented using by-one DRAMS.

14. The interface of claim 13 where in said multiplicity of DRAMs are all of the same technology.

15. An interface for a memory array including a multiplicity of DRAMs organized as two interleaved banks, a bank A and a bank B, each of said banks having a first multiplicity of partitions, each partition including data storage and data coherency storage, each of said partitions including a second multiplicity of bytes, said interface comprising:

a) a RAS controller residing on a first substrate, said RAS controller receiving a bank A RAS strobe signal and a first multiplicity of bank A partition select signals for selecting one of said first multiplicity of bank A partitions, said RAS controller generating a bank A data RAS signal and a bank A data coherency RAS signal for a selected partition within said bank A, said bank A data RAS signal having a minimum skew with respect to said bank A data coherency RAS signal, said RAS controller receiving a bank B RAS strobe signal and a first multiplicity of bank B partition select signals for selecting one of said first multiplicity of partitions within said bank B, said RAS controller generating a bank B data RAS signal and a bank B data coherency RAS signal for a selected partition within said bank B, said bank B data RAS signal having a minimum skew with respect to said bank B data coherency RAS signal; and b) a CAS controller residing on a second substrate, receiving a first multiplicity of bank A write enable signals and a bank A CAS strobe, said CAS controller generating a second multiplicity of bank A byte CAS signals and a second multiplicity of bank A byte write enable signals for said selected partition within said bank A, said bank A byte CAS signals having a minimum skew with respect to said bank A byte write enable signals, said CAS controller receiving a first multiplicity of bank B write enable signals and a bank B CAS strobe, said CAS controller generating a second multiplicity of bank B byte CAS signals and a second multiplicity of bank B byte write enable signals for said selected partition within said bank B, said bank B byte CAS signals having a minimum skew with respect to bank B byte write enable signals.

16. The interface of claim 15 wherein said CAS controller latches said first multiplicity of bank A write enable signals and said first multiplicity of bank B write enable signals.

17. The interface of claim 15 further comprising a latch for receiving memory array address signals and providing bank A partition address signals and bank B partition address signals.

18. The interface of claim 15 wherein data coherency is supported on byte boundaries.

19. The interface of claim 15 wherein data coherency is supported on partition boundaries.

20. The interface of claim 15 wherein said data storage is implemented using by-four DRAMs and said data coherency storage is implemented using by-one DRAMs.

21. The interface of claim 20 where in said multiplicity of DRAMs are all of the same technology.

22. The interface of claim 15 wherein said RAS controller latches said bank A partition select signals and latches said bank B partition select signals.

23. The interface claim 15 wherein said signals input to said interface and output from said bank A data bus and from said bank B data bus comprise no more than 150 signals.

* * * * *

UNITED STATES PATENT AND TRADEMARK OFFICE
CERTIFICATE OF CORRECTION

PATENT NO. : 5,265,053
DATED : November 23, 1993
INVENTOR(S) : Nardone, et. al.

It is certified that error appears in the above-indentified patent and that said Letters Patent is hereby corrected as shown below:

Title Page:
 [75] Inventors: Joseph M. Nardone, Portland; Tom Skoric, Beaverton, both of Oregon Col. 12, Line 3  Delete "RASA (3:0)" Insert --$\overline{\text{RASA (3:0)}}$--

Col. 12, Line 3  Delete "RASB (3:0)" Insert --$\overline{\text{RASB (3:0)}}$--

Col. 12, Line 6  Delete "RASX (3:0)" Insert --$\overline{\text{RASX (3:0)}}$--

Col. 12, Line 24  Delete "CASSTB(B:A), CASSEN(B:A)" Insert --$\overline{\text{CASSTB(B:A)}}$, $\overline{\text{CASSEN(B:A)}}$--

Col. 12, Line 32  Delete "MWE(A3:A0, B3:B0" Insert --$\overline{\text{MWE(A3:A0, B3:B0}}$--

Col. 12, Line 36  Delete "MWE(A3:A0, B3:B0" Insert --$\overline{\text{MWE(A3:A0, B3:B0}}$--

Col. 12, Line 38  Delete "MWE(A3:A0, B3:B0" Insert --$\overline{\text{MWE(A3:A0, B3:B0}}$--

Col. 12, Line 63  Delete "MWE(A3:A0, B3:B0" Insert --$\overline{\text{MWE(A3:A0, B3:B0}}$--

UNITED STATES PATENT AND TRADEMARK OFFICE
CERTIFICATE OF CORRECTION

PATENT NO. : 5,265,053
DATED : November 23, 1993
INVENTOR(S) : Nardone, et. al.

It is certified that error appears in the above-indentified patent and that said Letters Patent is hereby corrected as shown below:

Col. 14, Line 30    Delete" CASA(3:0) and CASB(3:0)," Insert -- CASA(3:0) and CASB(3:0),--

Signed and Sealed this

Nineteenth Day of July, 1994

Attest:

BRUCE LEHMAN

Attesting Officer    Commissioner of Patents and Trademarks